(12) United States Patent
Brandenberger et al.

(10) Patent No.: US 6,570,782 B1
(45) Date of Patent: May 27, 2003

(54) STORAGE AND RETRIEVAL FOR RESISTANCE-BASED MEMORY DEVICES

(75) Inventors: Sarah M. Brandenberger, Boise, ID (US); Peter J. Fricke, Corvallis, OR (US); Kenneth K. Smith, Boise, ID (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 0 days.

(21) Appl. No.: 10/050,668

(22) Filed: Jan. 16, 2002

(51) Int. Cl.$^7$ .............................................. G11C 17/00
(52) U.S. Cl. ......................... 365/100; 365/97; 365/158
(58) Field of Search ........................ 365/100, 97, 158, 365/148, 230.07, 243.5, 171

(56) References Cited

U.S. PATENT DOCUMENTS 6,483,734 B1 * 11/2002 Sharma et al. ................ 365/97

* cited by examiner

*Primary Examiner*—David Lam

(57) ABSTRACT

Methods for storing a bit sequence are provided. A representative method for storing a bit sequence includes converting a first bit sequence containing a first number of low-resistance bits into a second bit sequence containing a second number of low-resistance bits that is lower than the first number of low-resistance bits, and then storing the second bit sequence in a resistance-based memory device. Systems, computer-readable media, and other methods for storing and retrieving a bit sequence are also provided.

24 Claims, 8 Drawing Sheets

STORAGE AND RETRIEVAL FOR RESISTANCE-BASED MEMORY DEVICES

FIELD OF THE INVENTION

The invention is generally related to resistance-based memory devices and, more particularly, is related to systems and methods for storing and retrieving data and software in resistance-based memory devices.

DESCRIPTION OF THE RELATED ART

There is an increasing demand for cost-effective resistance-based memory modules which offer the advantage of reduced size and improved storage capacity. A resistance based memory module may be, for example, a read only memory (ROM) or a magnetic random access memory (MRAM). Each memory cell in a resistance-based memory module comprises a resistive memory component. The resistance value of any one memory component can be designed to be relatively high (e.g., 10 Meg ohms), which translates to a logical bit value of one, or relatively low (e.g., 100 Kilo ohms), which translates to a logical bit value of zero. The resistance of a selected memory cell can be determined by applying a voltage to the memory cell and measuring the current that flows through it. The resistance value of a memory cell is proportional to the value of the current flowing through it.

One problem with resistance-based memory modules is that during a read operation for determining the resistance value of a memory component, a parasitic or "sneak" current may flow through adjacent memory components that are not being read and may cause a false reading for the targeted memory component. Furthermore, resistance-based memory modules are often incorporated into portable wireless communications systems which have a need for low power consumption. Therefore, there is a need for systems and methods for reducing sneak currents and/or power consumption in resistance-based memory modules.

SUMMARY OF THE INVENTION

The present invention provides systems and methods for storing and retrieving data and software. In one embodiment of the invention, a method for storing a bit sequence includes converting a first bit sequence containing a first number of low-resistance bits into a second bit sequence containing a second number of low-resistance bits that is lower than the first number of low-resistance bits, and then storing the second bit sequence in a resistance-based memory device.

In another embodiment of the invention, a method for retrieving a bit sequence includes retrieving a first bit sequence from a resistance-based memory device, and then converting the first bit sequence containing a first number of low-resistance bits into a second bit sequence containing a second number of low-resistance bits that is higher than the first number of low-resistance bits.

BRIEF DESCRIPTION OF THE DRAWINGS

The invention can be better understood with reference to the following drawings. The components in the drawings are not necessarily to scale, emphasis instead being placed upon clearly illustrating the principles of the invention. Moreover, in the drawings, like reference numerals designate corresponding parts throughout the several views.

DETAILED DESCRIPTION

As will be described in greater detail herein, systems and methods of the present invention can reduce the levels of power consumption and sneak currents in resistance-based memory devices. Preferably, this is accomplished by reducing the number of "low-resistance" bits that are stored using low-resistance components in a resistance-based memory device. In one embodiment of the invention, the number of low-resistance bits is reduced by inverting bit sequences containing a certain threshold of low-resistance bits. In another embodiment, reducing the number of low-resistance bits is achieved by expanding a bit sequence to include a greater number of total bits but a smaller number of low resistance bits.

Figure 1:
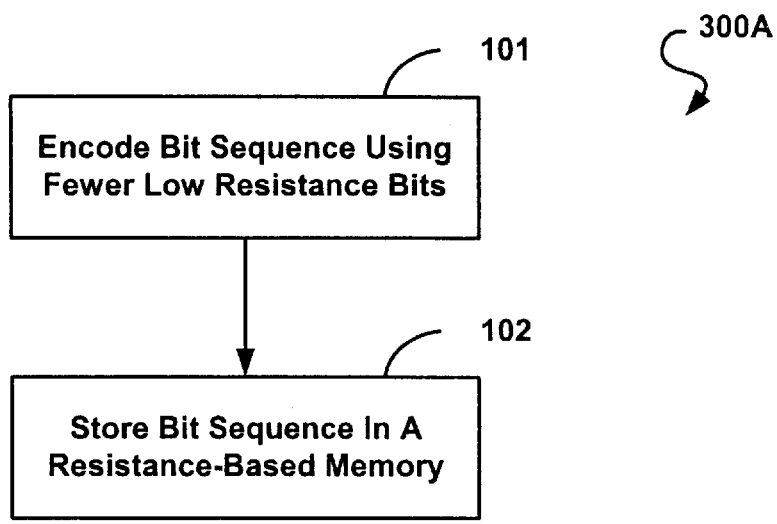
FIG. 1 depicts an embodiment of a method of the present invention for storing a bit-sequence in a resistance-based memory.

Referring now to the drawings, FIG. 1 depicts an embodiment of a method 300A for storing a bit-sequence in a resistance-based memory. The bit-sequence may be data or executable code. The resistance-based memory may be any memory device in which a value of a stored bit is determined by the resistance of a memory component. For example, a memory component having a higher resistance stores a logic 0 and a memory component having a lower resistance stores a logic 1, or vice versa depending on the desired implementation. In step 101, a first bit-sequence containing a certain number of low-resistance bits is converted into a second bit-sequence containing a lower number of low-resistance bits. In this context, a "low-resistance bit" is a bit that is stored in a relatively lower resistance memory component and a "high-resistance bit" is a bit that is stored in a relatively higher resistance memory component. In step 102, the second bit sequence is stored in a resistance-based memory device.

The levels of power consumption and sneak currents in a resistance-based memory can be reduced by reducing the number of low-resistance bits that are stored since the current flowing through a resistive element in a resistance-based memory is inversely correlated to the element's resistance. Reducing sneak currents lowers the likelihood of a false reading for a targeted memory component whereas reducing power consumption increases battery life in handheld consumer devices. The level of power consumed can be reduced because reading a value in a memory component typically involves applying a voltage to the memory component and measuring the current that flows through the memory component. The power consumed by reading a memory component is equal to $(V^2)/R$; where V is the applied voltage and R is the resistance of the memory component. For example, if a high-resistance bit is stored in a memory component having a relatively high resistance of 10 Meg ohms and a low-resistance bit is stored in a memory component having a relatively low resistance of 100 Kilo ohms, then the power required to read the low-resistance bit would be 100 times greater (10 Meg ohms /100 Kilo ohms) than the power required to read the high-resistance bit. Furthermore, writing a low-resistance bit into a resistance-based memory consumes significantly more power than writing a high-resistance bit. Therefore, method 300A can significantly lower the power requirements for a resistance-based memory device.

Another advantage provided by method 300A is than it can significantly reduce the time required to store data and/or software in a resistance-based memory device. A typical resistance-based memory device initially only contains high-resistance memory elements that are selectively converted to low-resistance memory elements based on the content of the data or software that is stored therein. Therefore, if fewer low-resistance bits are stored in a resistance-based memory device, then fewer high-resistance memory elements are converted to low-resistance memory elements and, consequently, data and software can be stored at a faster rate.

Figure 2:
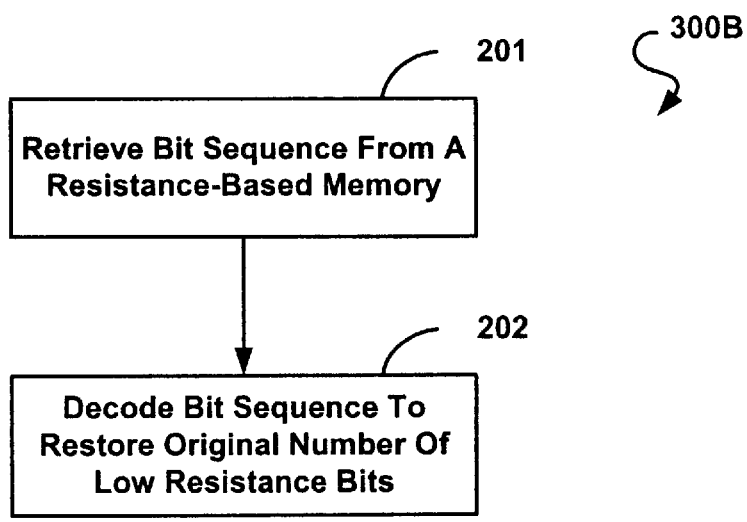
FIG. 2 depicts an embodiment of a method of the invention for retrieving a bit-sequence that was stored in a resistance-based memory using a method such as that depicted in FIG. 1.

FIG. 2 depicts an embodiment of a method 300B for retrieving a bit-sequence from a resistance-based memory. The bit-sequence may be data or executable code. In step 201, a bit sequence containing a certain number of low-resistance bits (e.g., logic 1 bits) is retrieved from a resistance-based memory device. In step 202, the bit-sequence is converted (decoded) into another bit-sequence containing a higher number of low-resistance bits. The decoding may be achieved by essentially performing the inverse of the encoding step 101 (FIG. 1). The encoding step 101 and the decoding step 202 may each be achieved using logic that is implemented in software, hardware, or a combination thereof.

In an alternative embodiment, the methods illustrated in FIGS. 1 and 2 may be used in connection with other memory devices wherein reading of one type of bit (e.g., logic 0) consumes more power than reading another type of bit (e.g., logic 1). Such memory devices include transistor based devices such as, for example, Electrically Erasable Programmable Read Only Memory (EEPROM).

Figure 3:
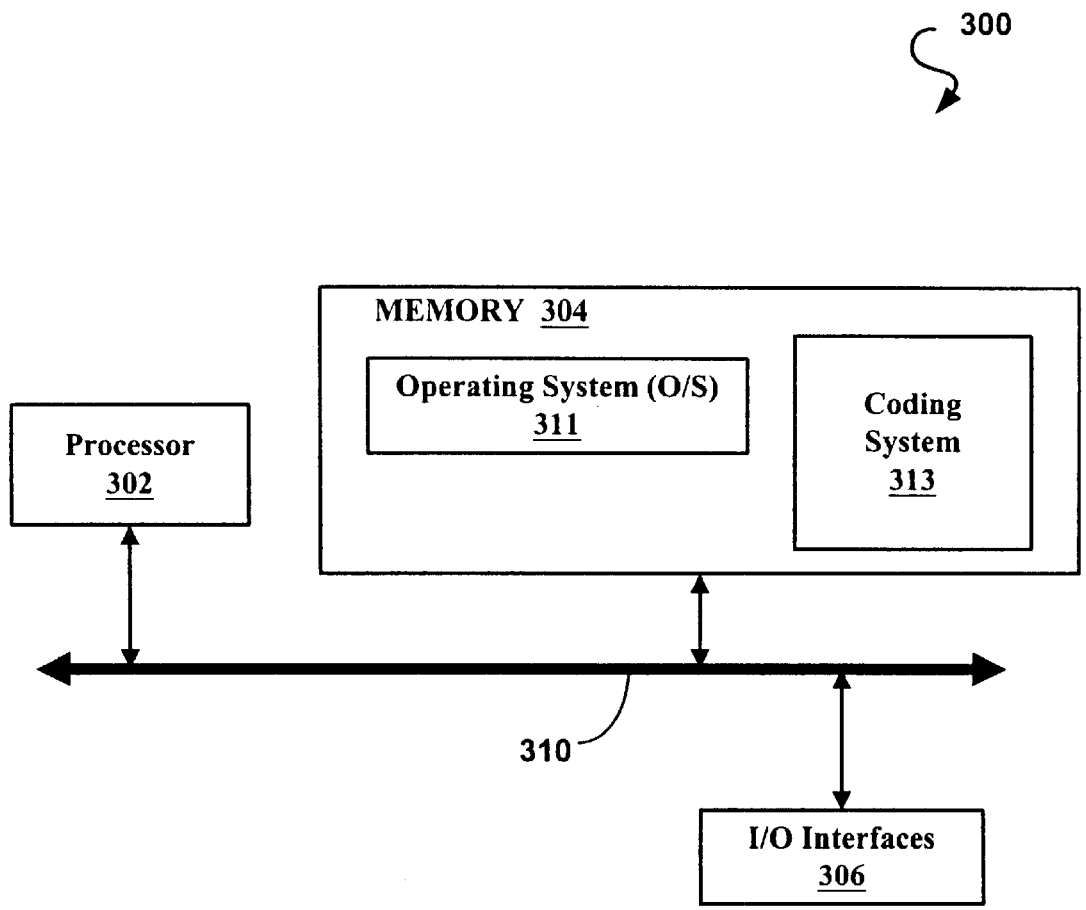
FIG. 3 is a block diagram depicting a non-limiting example of a storage system that can be used to implement the methods shown in FIG. 1 and/or FIG. 2.

FIG. 3 is a block diagram depicting a non-limiting example of a storage system (SS) 300 that can be used to implement the steps shown in FIG. 1 and/or FIG. 2. The SS 300 may be a digital computer that, in terms of hardware architecture, generally includes a processor 302, memory system 304, and input/output (I/O) interfaces 306. These components (302, 304, and 306) are communicatively coupled via a local interface 310. The local interface 310 can be, for example but not limited to, one or more buses or other wired or wireless connections, as is known in the art. The local interface 310 may have additional elements, which are omitted for simplicity, such as controllers, buffers (caches), drivers, repeaters, and receivers, to enable communications. Further, the local interface may include address, control, and/or data connections to enable appropriate communications among the aforementioned components.

The processor 302 is a hardware device for executing software, particularly that stored in memory system 304.

The processor 302 can be any custom made or commercially available processor, a central processing unit (CPU), an auxiliary processor among several processors associated with the SS 300, a semiconductor-based microprocessor (in the form of a microchip or chip set), or generally any device for executing software instructions. When the SS 300 is in operation, the processor 302 is configured to execute software stored within the memory system 304, to communicate data to and from the memory system 304, and to generally control operations of the SS 300 pursuant to the software. In one embodiment of the invention, memory system 304 comprises resistance-based memory. In another embodiment, the SS 300 is in communication with a resistance-based memory component (not shown) via I/O interfaces 306.

The I/O interfaces 306 may be used to receive user input from and/or to provide system output to one or more devices or components. User input may be provided via, for example, a keyboard and/or a mouse. System output may be provided via a display device and a printer (not shown). Communication interfaces 306 may include, for example, a serial port, a parallel port, a Small Computer System Interface (SSSI), an IR interface, an RF interface, and/or a universal serial bus (USB) interface.

The memory system 304 can include any one or combination of volatile memory elements (e.g., random access memory (RAM, such as DRAM, SRAM, SDRAM, etc.)) and nonvolatile memory elements (e.g., ROM, hard drive, tape, CDROM, etc.). Moreover, the memory system 304 may incorporate electronic, magnetic, optical, and/or other types of storage media. Note that the memory system 304 can have a distributed architecture, where various components are situated remote from one another, but can be accessed by the processor 302.

The software in memory system 304 may include one or more software programs, each of which comprises an ordered listing of executable instructions for implementing logical functions. In the example of FIG. 3, the software in the memory system 304 includes a coding system 313 and a suitable operating system (O/S) 311. The coding system 313 may be used for coding and/or decoding data and software that is stored in or retrieved from the memory system 304. The operating system 311 essentially controls the execution of other computer programs, such as the coding system 313, and provides scheduling, input-output control, file and data management, memory management, and communication control and related services.

The O/S may be responsible for "padding" files so that they contain a whole number of "blocks" or "sectors." A sector size may be, for example, 512 bytes, 1024 bytes, or 2048 bytes. If a certain file does not contain a multiple of the sector size, it is then padded with additional bits so that it may contain a whole number of sectors. In one embodiment of the invention, the O/S 311 is configured to pad files using high-resistance bits instead of low-resistance bits thereby resulting in a significant reduction in power consumption by the memory system 304.

If the SS 300 is a desktop computer, notebook computer, workstation, or the like, software in the memory system 304 may include a basic input output system (BIOS) (not shown). The BIOS is a set of essential software routines that initialize and test hardware at startup, start the O/S 311, and support the transfer of data among the hardware devices. The BIOS is stored in ROM so that the BIOS can be executed when the SS 300 is activated.

The coding system 313 may be a source program, an executable program (object code), a script, or any other entity comprising a set of instructions to be performed. When the coding system 313 is a source program, then the coding system 313 may be translated via a compiler, assembler, interpreter, or the like, which may or may not be included within the memory system 304, so as to operate properly in connection with the O/S 311. Furthermore, the coding system 313 can be written as (a) an object oriented programming language, which has classes of data and methods, or (b) a procedure programming language, which has routines, subroutines, and/or functions, such as, for example, but not limited to, C, C++, Pascal, Basic, Fortran, Cobol, Perl, Java, and Ada.

When the coding system 313 is implemented in software, as is shown in FIG. 3, it should be noted that the coding system 313 can be stored on any computer readable medium for use by or in connection with any computer related system or method. In the context of this document, a computer readable medium is an electronic, magnetic, optical, or other physical device or means that can contain or store a computer program for use by or in connection with a computer related system or method. The coding system 313 can be embodied in any computer-readable medium for use by or in connection with an instruction execution system, apparatus, or device, such as a computer-based system, processor-containing system, or other system that can fetch the instructions from the instruction execution system, apparatus, or device and execute the instructions. In the context of this document, a "computer-readable medium" can be any means that can store, communicate, propagate, or transport the program for use by or in connection with the instruction execution system, apparatus, or device. The computer readable medium can be, for example but not limited to, an electronic, magnetic, optical, electromagnetic, infrared, or semiconductor system, apparatus, device, or propagation medium. More specific examples (a non-exhaustive list) of the computer-readable medium would include the following: an electrical connection (electronic) having one or more wires, a portable computer diskette (magnetic), a random access memory (RAM) (electronic), a read-only memory (ROM) (electronic), an erasable programmable read-only memory (EPROM, EEPROM, or Flash memory) (electronic), an optical fiber (optical), and a portable compact disc read-only memory (CDROM) (optical). Note that the computer-readable medium could even be paper or another suitable medium upon which the program is printed, as the program can be electronically captured, via for instance optical scanning of the paper or other medium, then compiled, interpreted or otherwise processed in a suitable manner if necessary, and then stored in a computer memory.

In an alternative embodiment, the coding system 313 may be implemented in hardware using, for example, any or a combination of the following technologies which are each well known in the art: a discrete logic circuit(s) having logic gates for implementing logic functions upon data signals, an application specific integrated circuit (ASIC) having appropriate combinational logic gates, a programmable gate array (s) (PGA), a field programmable gate array (FPGA), etc.

Figure 4:
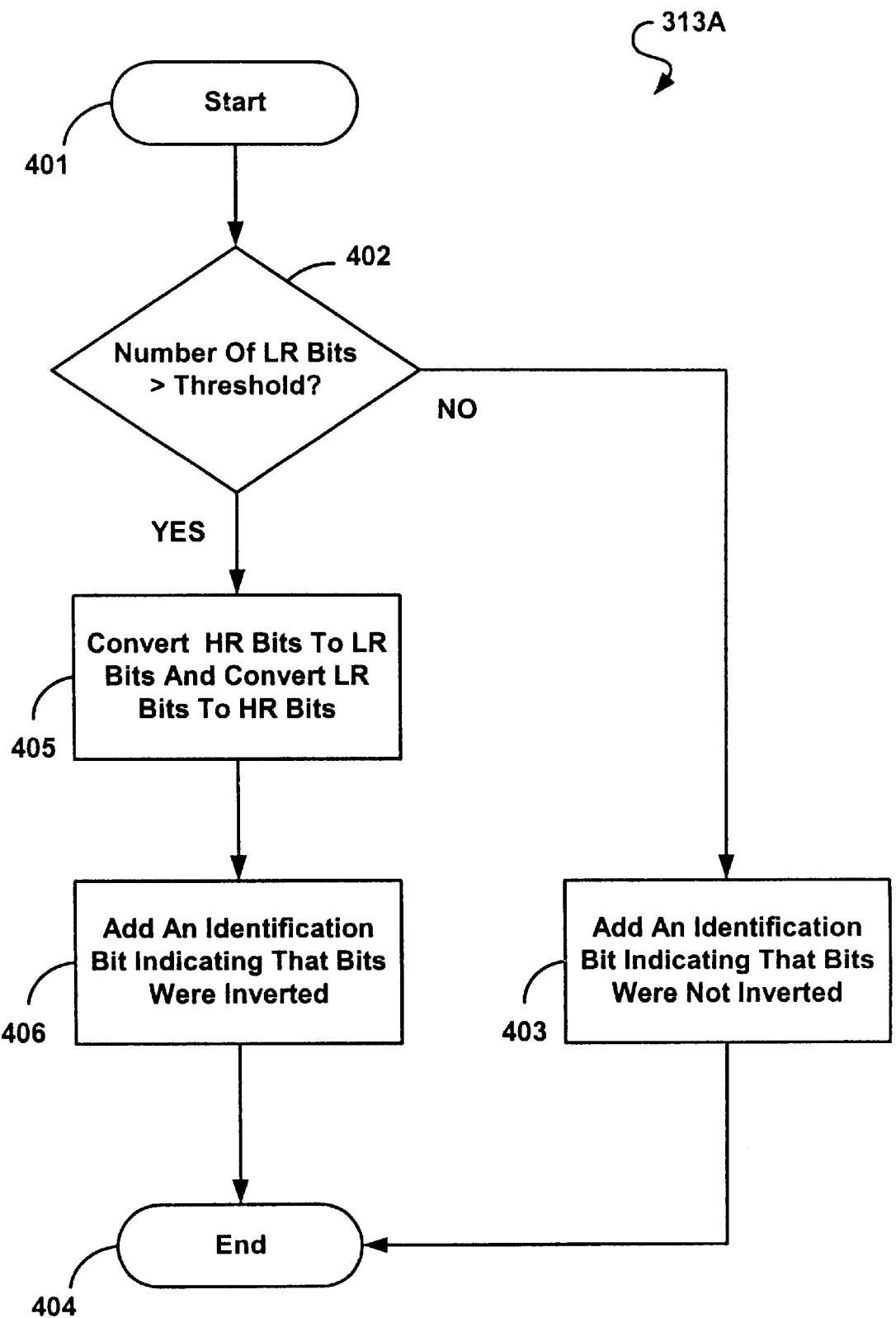
FIG. 4 depicts a non-limiting example of a method that may be performed by the coding system depicted in FIG. 3.

FIG. 4 is a flowchart that depicts an encoding method 313A that may be implemented by the coding system 313 (FIG. 3) of the invention. As shown in FIG. 4, the encoding method 313A is initiated in step 401 in response to the coding system 313 receiving a bit sequence that is to be encoded. After receiving the bit sequence, the coding system 313 determines in step 402 if the number of low-resistance (LR) bits is greater than a predetermined threshold. In one embodiment, the threshold is set to be equal to half the total number of bits in the received bit sequence. If the coding system 313 determines in step 403 that the number of LR bits is not greater than the predetermined threshold, then the coding system 313 adds an identification bit to the bit sequence indicating that bits in the bit sequence were not inverted, and the method terminates in step 404. The identification bit is predetermined to be either a logic 0 or a logic 1 and may be inserted at a predetermined location in the bit sequence. The identification bit is preferably added at the beginning or end of the bit sequence.

If the coding system 313 determines in step 402 that the number of LR bits is greater than the predetermined threshold, then in step 405, the coding system 313 inverts the bits in the bit sequence such that high-resistance (HR) bits are converted to LR bits and LR bits are converted to HR bits. After the bits are inverted, the coding system 313 adds an identification bit to the bit sequence indicating that the bits were inverted, as indicated in step 406. The type of identification bit that is added in step 406 is the complement of the identification bit that is added in step 403. For example, if the identification bit that is added in step 403 is logic 0, then the identification bit that is added in step 406 is a logic 1, and vice versa. The identification bit is inserted at a predetermined location in the bit sequence. After the identification bit is added in step 406, the method terminates as indicated in step 404.

In a non-limiting example in which a logic 1 is a LR bit and a logic 0 is a HR bit, if the coding system 313 receives the bit sequence "00111111" to be encoded, then the coding system would convert the bit sequence into "11000000" and would then add the identification bit "1" to indicate that the bit sequence has been inverted. The resulting bit sequence may become, for example, "110000001" where the logic 1 on the far right is the identification bit. In another example, if the coding system 313 receives the bit sequence "00000011" to be encoded, then the coding system 313 would not invert the bit sequence and would add the identification bit "0" to indicate that the bit sequence has not been inverted. The resulting bit sequence may become, for example, "000000110", where the logic 0 on the far right is the identification bit. In an alternative embodiment in which a logic 0 is a LR bit and a logic 1 is a HR bit, the bit sequence "00000011" may, for example, be converted by the coding system 313 into the bit sequence "111111001."

The shortest bit sequence that may be advantageously encoded in accordance with the method illustrated in FIG. 4 is a 2-bit sequence. By inverting 2-bit sequences containing 2 LR bits into 2-bit sequences containing 2 HR bits and then adding an LR bit to indicate that the bit sequence has been inverted, a 25% reduction in LR bits may be achieved among a collection of randomly selected 2-bit sequences. However, inverting 2-bit sequences may yield little or no benefit if the resistance of a high-resistance memory element is not significantly greater than the resistance of a low-resistance memory element. It should be noted that the proportion of LR bits that can be converted to HR bits may decrease as the length of individual bit sequences that are inverted is increased. Selecting an ideal length for a bit sequence that is inverted may depend on several factors including, for example, the specific type of memory device used, the resistance of the HR and LR memory components, the signal-to-noise ratio involved in reading a memory element, etc.

Figure 5:
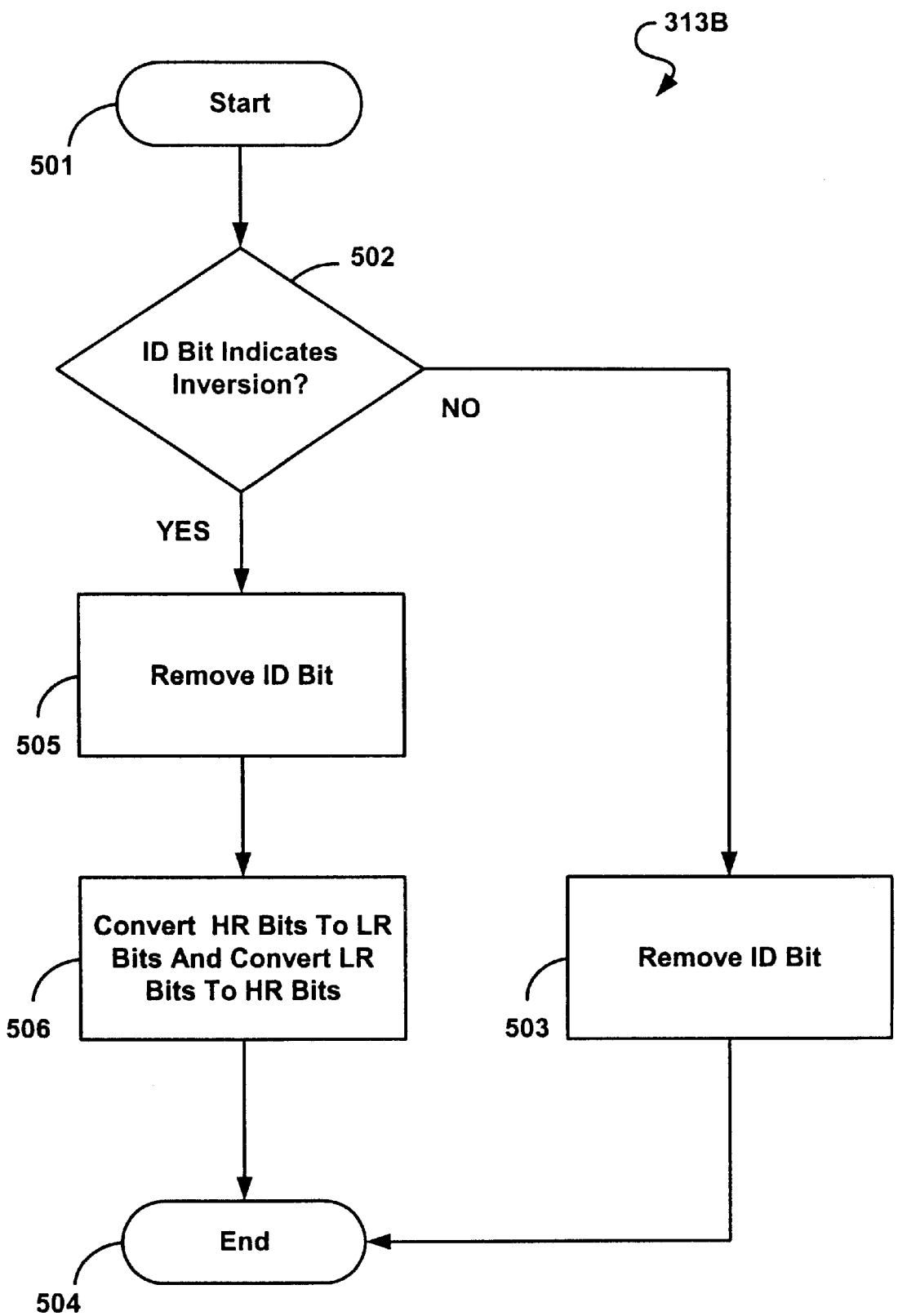
FIG. 5 depicts a non-limiting example of a method that may be performed by the coding system depicted in FIG. 3.

FIG. 5 is a flowchart that depicts an decoding method 313B that may be implemented by the coding system 313 (FIG. 3) of the invention. As shown in FIG. 4, the decoding method 313B is initiated in step 501 in response to the coding system 313 receiving a bit sequence that is to be decoded. After receiving the bit sequence, the coding system 313 determines in step 502 if an identification bit indicates that the bit sequence is an inverted bit sequence. If the bit sequence is not an inverted bit sequence, then the coding system 313 removes the identification bit from the bit sequence in step 503, and the method terminates in step 504. If the coding system 313 determines in step 502 that the bit sequence is an inverted bit sequence, then in step 505, the coding system 313 removes the identification bit from the bit sequence and inverts the bits in the bit sequence such that HR bits are converted to LR bits and LR bits are converted to HR bits, as indicated in block 506. After the bits in the bit sequence are inverted, the method 313B terminates as indicated in step 504.

In a non-limiting example, if the coding system 313 receives the bit sequence "110000001" to be decoded, then the coding system 313 would determine that the bit sequence is an inverted bit sequence based on the identification bit "1" that is at the far right of the bit sequence. The coding system 313 would then remove the identification bit and would invert the remaining bits to arrive at the bit sequence "00111111". In another example, if the coding system 313 receives the bit sequence "000000110" to be decoded, then the coding system 313 would determine that the bit sequence is not an inverted bit sequence based on the identification bit "0" that is at the far right of the bit sequence. The coding system 313 would then remove the identification bit and would not invert the remaining bits. In an alternative embodiment in which a logic 0 is a LR bit and a logic 1 is a HR bit, the bit sequence "111111001" may, for example, be decoded by the coding system 313 into the bit sequence "00000011."

It will be appreciated by persons of ordinary skill in the art that the examples above are merely illustrative. Therefore, in one implementation, a bit sequence that is coded or decoded may be shorter or longer than illustrated. In another implementation, each identification bit "1" and "0" may be assigned a different meaning and may be located at a different position in a bit sequence than illustrated above. Furthermore, a different number of identification bits may be used in connection with each bit sequence.

Figure 6:
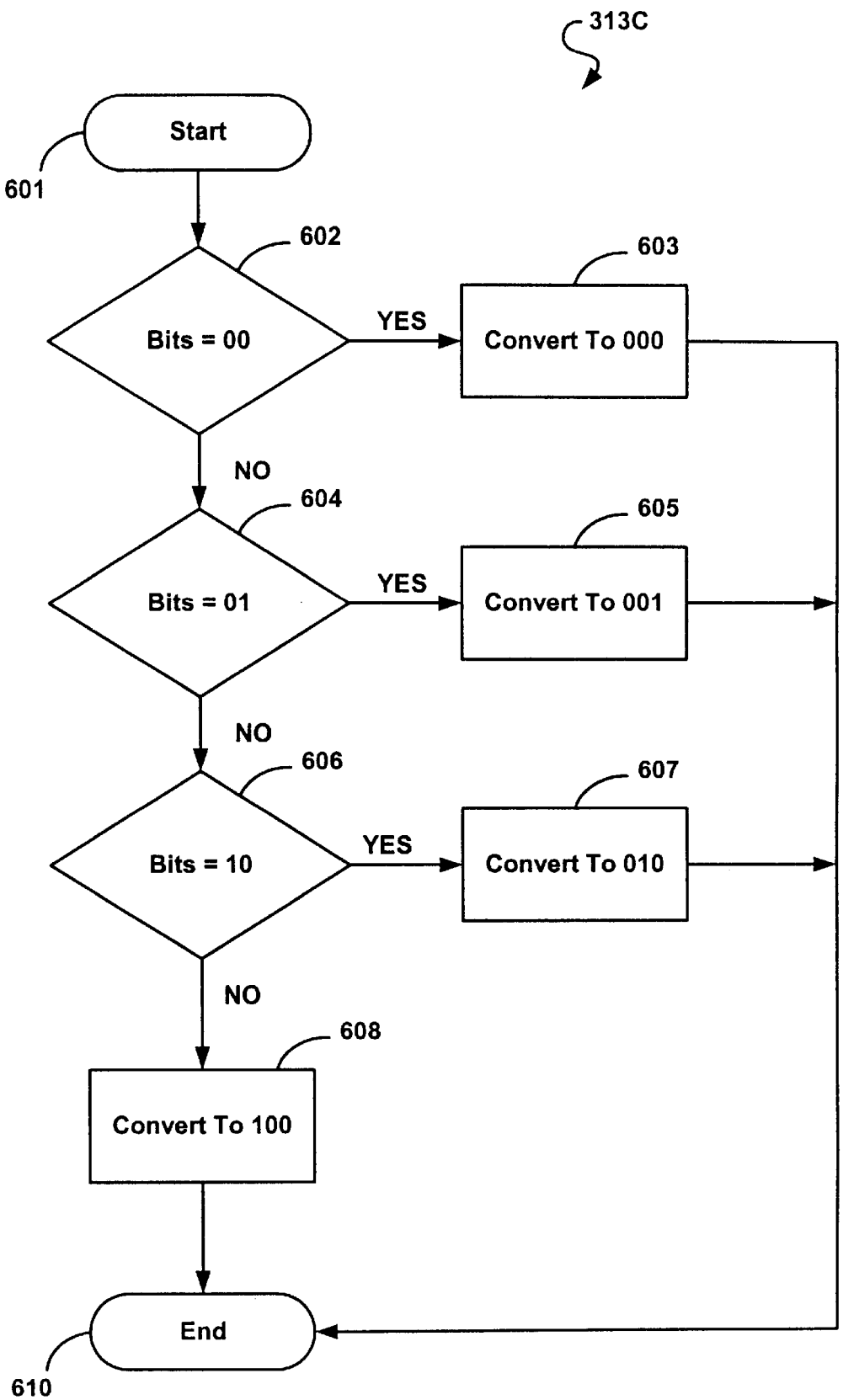
FIG. 6 depicts a non-limiting example of a data expansion method for encoding a portion of a bit sequence in accordance with an alternative embodiment to the method depicted in FIG. 4.

FIG. 6 depicts a non-limiting example of a data encoding method 313C for encoding a portion of a bit sequence in accordance with an alternative embodiment to the encoding method 313A (FIG. 4). The data encoding method 313C may be implemented by the coding system 313 (FIG. 3) and may be initiated when a 2-bit sequence is to be encoded. After the encoding method 313C is initiated as indicated in step 601, the coding system 313 determines in step 602 if a 2-bit sequence that is received by the coding system 313 is equal to 00. If the 2-bit sequence is equal to 00, then the coding system 313 converts the bit sequence to 000 as indicated in step 603. If the 2-bit sequence is not equal to 00 then the coding system 313 determines in step 604 if the 2-bit sequence is equal to 01. If the 2-bit sequence is equal to 01, then the coding system 313 converts the bit sequence to 001 as indicated in step 605. If the 2-bit sequence is not equal to 01 then the coding system 313 determines in step 606 if the 2-bit sequence is equal to 10. If the 2-bit sequence is equal to 10, then the coding system 313 converts the bit sequence to 010 as indicated in step 607. If the 2-bit sequence is not equal to 10, then the coding system 313 converts the bit sequence to 100 as indicated in step 608 and terminates as indicated in step 610. The encoding method 313C may be repeatedly performed until the desired data or software is encoded.

In a non-limiting example, the encoding method 313C may be used to expand the bit sequence 00011011 into 000001010100. Note that 00011011 can be broken up into the 2-bit sequences 00-01-10-11 which can then be converted by the coding system 313 into respective 3 bit-sequences 000-001-010-100. A person of ordinary skill in the art will appreciate upon inspection that the encoding method 313C may be used to reduce the number of LR bits by an average of 25%. In an alternative embodiment, if a logic 0 is an LR bit and if a logic 1 is an HR bit, then the 2-bit sequences 00, 01, 10, and 11 may be converted by the coding system 313 into, for example, the 3-bit sequences 011, 101, 110, and 111.

It will also be appreciated by a person of ordinary skill in the art that similar results may be achieved by converting any of the 2-bit sequences 00, 01, 10, and 11 into any of the 3 bit sequences 000, 001, 010, 100 if such conversion is performed on a consistent basis. For example, steps 603 and 605 or steps 607 and 608 may be interchanged without impacting the performance of the encoding method 313C. In an alternative embodiment, a data encoding method may convert bit sequences having a greater number of bits. For example, the following 3-bit sequences 000, 001, 010, 011, 100, 101, 110, and 111 may be converted into the 4-bit sequences 0000, 0001, 0010, 0100, 1000, 1001, 1010, and 1100. However, converting 2-bit sequences into 3-bit sequences may be more effective at reducing the number of LR bits.

Figure 7:
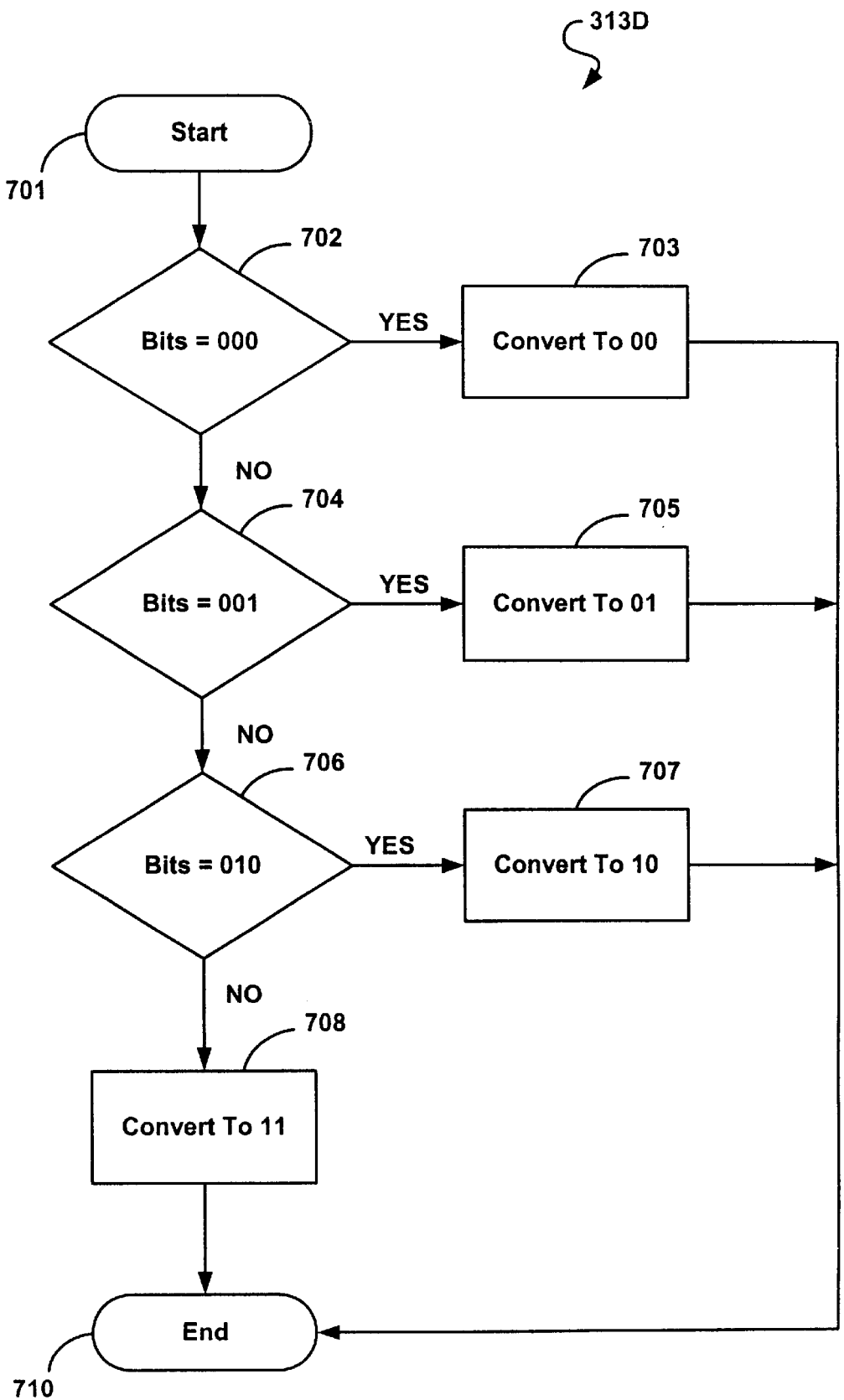
FIG. 7 depicts a non-limiting example of a data decoding method for decoding a bit sequence that was encoded using the method depicted in FIG. 6.

FIG. 7 depicts a non-limiting example of a data decoding method 313D for decoding a bit sequence that was encoded using the encoding method 313C (FIG. 6). The method 313D may be implemented by the coding system 313 (FIG. 3) and may be initiated when a 3-bit sequence is to be decoded. After the method 313D is initiated as indicated in step 701, the coding system 313 determines in step 702 if a 3-bit sequence that is received by the coding system 313 is equal to 000. If the 3-bit sequence is equal to 000, then the coding system 313 converts the bit sequence to 00 as indicated in step 703. If the 3-bit sequence is not equal to 000 then the coding system 313 determines in step 704 if the 3-bit sequence is equal to 001. If the 3-bit sequence is equal to 001, then the coding system 313 converts the bit sequence to 01 as indicated in step 705. If the 3-bit sequence is not equal to 001 then the coding system 313 determines in step 706 if the 3-bit sequence is equal to 010. If the 3-bit sequence is equal to 010, then the coding system 313 converts the bit sequence to 10 as indicated in step 707. If the 3-bit sequence is not equal to 010, then the coding system 313 converts the bit sequence to 11 as indicated in step 708 and terminates as indicated in step 710. The method 313D may be repeatedly executed until the desired data or software is decoded. In a non-limiting example, the method 313D may be used to decode the bit sequence 000001010100 into 00011011. Note that 000001010100 can be broken up into the 3-bit sequences 000-001-010-100 which can then be converted by the method 313D into respective 2-bit-sequences 00-01-10-11. In an alternative embodiment, a decoding method for decoding a bit-sequence that was encoded using a method other than 313C may comprise steps that are different than those illustrated in FIG. 7.

Any blocks or steps shown in FIGS. 4–7 represent modules, segments, or portions of code which include one or more executable instructions for implementing specific logical functions or steps in a process. In an alternative implementation the functions or steps depicted in the flowcharts may be executed out of order from that shown or discussed, including substantially concurrently or in reverse order, depending on the functionality involved, as would be understood by those reasonably skilled in the art.

It will also be appreciated by those skilled in the art that the functionality provided by each of the methods illustrated in FIGS. 4–7, can also be implemented through hardware (e.g., an application specific integrated circuit (ASIC) and supporting circuitry). Each implementation may have a perceived advantage, however. For example, hardware enjoys a speed and, arguably, a reliability advantage over software because hardware testing and verification methods are currently more advanced than software verification methods. On the other hand, software can be less expensive than customized hardware and offers greater flexibility in adding or modifying product features.

The functionality provided by each of the methods illustrated in FIGS. 4–7, can be embodied in any computer-readable medium for use by or in connection with a computer-related system (e.g., an embedded system such as a modem) or method. In this context of this document, a computer-readable medium is an electronic, magnetic, optical, semiconductor, or other physical device or means that can contain or store a computer program or data for use by or in connection with a computer-related system or method. Also, the computer program or data may be transferred to another computer-readable medium by any suitable process such as by scanning the computer-readable medium. Thus, the computer-readable medium could be paper or other suitable medium upon which the computer program can be printed, scanned with an optical scanner, and transferred into the computer's memory or storage.

Figure 8:
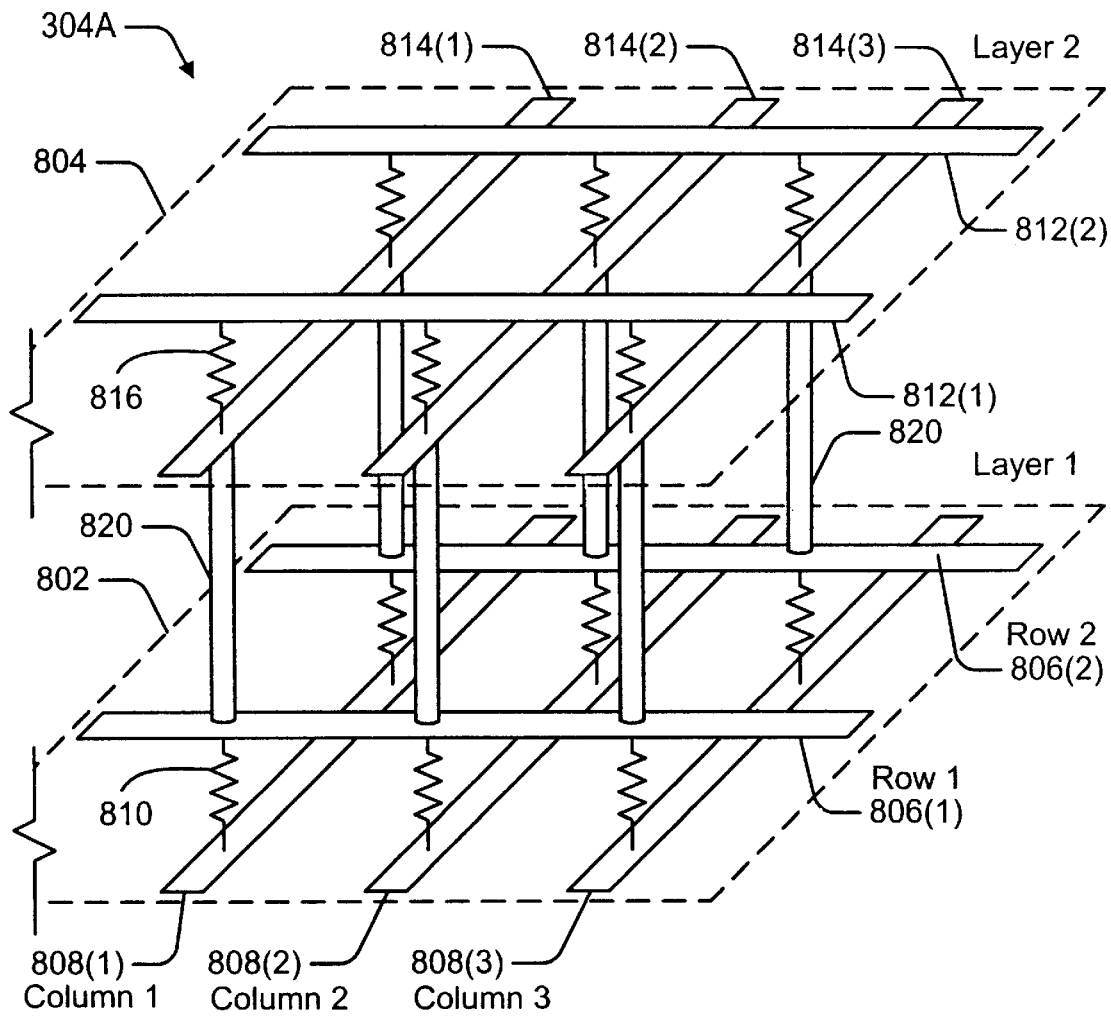
FIG. 8 is a schematic diagram depicting one type of a resistance-based memory device that may be incorporated into the memory system depicted in FIG. 3.
Figure 9:
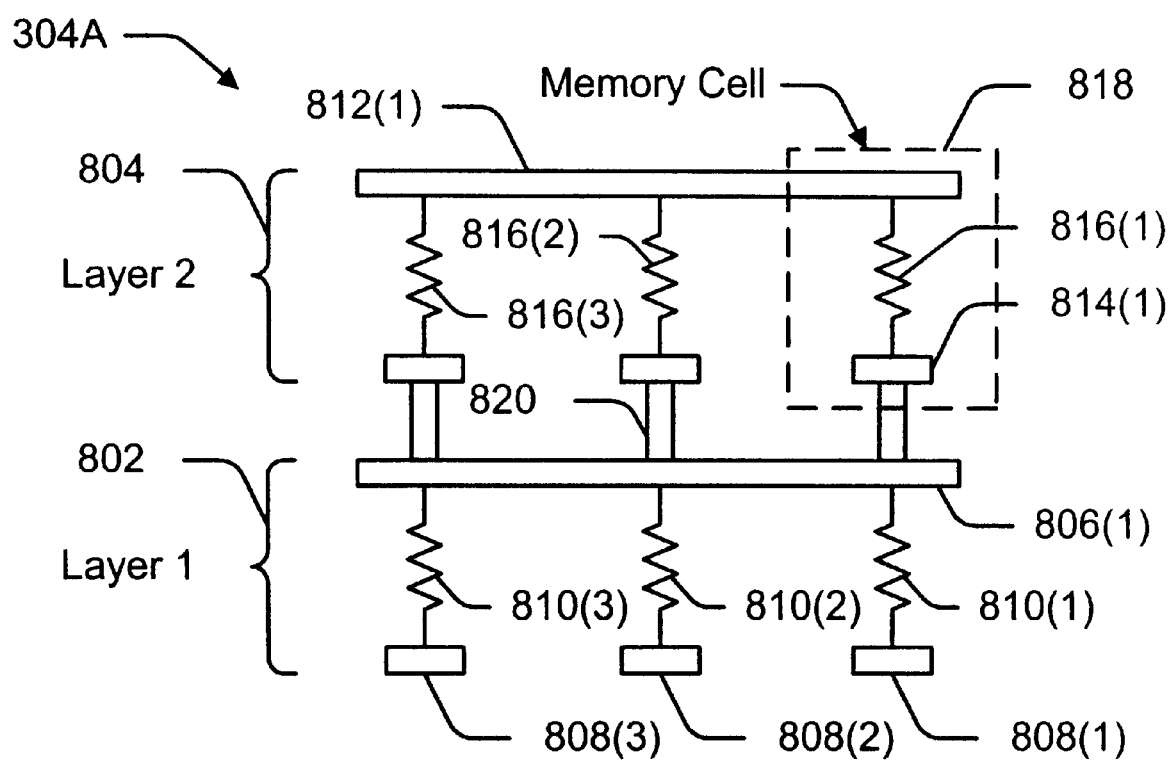
FIG. 9 is a schematic diagram depicting another view of the resistance-based memory device shown in FIG. 8.

FIGS. 8 and 9 are schematic diagrams depicting one example, among others, of a resistance-based memory device 304A that may be incorporated into the memory system 304 (FIG. 3) or that may be used to store and/or retrieve data using the methods illustrated in FIGS. 1 and 2. In this example, the memory based device 304A is a non-volatile, multi-level read-only memory (ROM) device. Other types of resistance-based memory devices include, for example, but not limited to, magnetic random access memory (MRAM). As shown in FIGS. 8 and 9, memory device 304A has two layers: a first layer 802 and a second layer 804. The first layer 802 of memory device 304A has conductive traces that are formed as rows of conductive material 806(1–2) crossing over columns of conductive material 808(1–3).

The first layer 802 also has memory components 810 illustrated as resistors in the schematic. Each memory component 810 is connected between a row of conductive material and a column of conductive material. For example, memory component 810(1) is connected between the row of conductive material 806(1) and the column of conductive material 808(1). Similarly, the second layer 804 has conductive traces that are formed as rows of conductive material 812(1–2) crossing over columns of conductive material 814(1–3). Memory components 816 are connected between a cross-point of a row of conductive material and a column of conductive material, which is designated as a memory cell. For example, memory cell 818 includes a memory component 816(1) connected between a cross-point of the row of conductive material 812(1) and the column of conductive material 814(1).

Each layer of the memory device 304A has multiple memory cells, and each memory cell has a memory component. Each memory component (e.g., the resistors in FIG. 2) has a determinable resistance value when a potential is applied to the memory component. The resistance value of any one memory component at any cross-point can be designed to be relatively high (e.g., 10 Meg ohms), which translates to a logical bit value of one, or relatively low (e.g., 100 Kilo ohms), which translates to a logical bit value of zero. Correlating a relatively high resistance with a logical one, and a relatively low resistance with a logical zero is an implementation design choice. Accordingly, a relatively high resistance value can be defined as a logical zero and a relatively low resistance value can be defined as a logical one.

The memory cells of the first layer 802 and the memory cells of the second layer 804 are electrically insulated with a non-conductive material 820. Although shown in the schematic as individual insulators 820 between memory cells, the non-conductive material 820 can be formed as a solid layer between the first layer 802 and the second layer 804. Those skilled in the art will appreciate that the memory device 304A may be fabricated with any number of layers and with any number of memory cells per layer as may be suitable for a desired implementation.

It should be emphasized that the above-described embodiments of the invention are merely possible examples, among others, of the implementations, setting forth a clear understanding of the principles of the invention. Many variations and modifications may be made to the above-described embodiments of the invention without departing substantially from the principles of the invention. All such modifications and variations are intended to be included herein within the scope of the disclosure and present invention and protected by the following claims.

What is claimed is:

1. A method for storing a bit sequence in a resistance-based memory device, the resistance-based memory device storing bits as low-resistance bits and high-resistance bits, said method comprising:

converting a first bit sequence containing a first number of low-resistance bits into a second bit sequence containing a second number of low-resistance bits that is lower than the first number of low-resistance bits; and storing the second bit sequence in the resistance-based memory device.

2. The method of claim 1, wherein a low-resistance bit is stored using a resistive component having a first resistance, and a high-resistance bit is stored using a resistive component having a second resistance that is higher than the first resistance.

3. The method of claim 1, wherein a low-resistance bit represents a first logic state and a high-resistance bit represents a second logic state.

4. The method of claim 3, wherein a low-resistance bit is a logic 1 and a high-resistance bit is a logic 0.

5. The method of claim 1, wherein the step of converting comprises performing data expansion.

6. The method of claim 1, wherein the step of converting comprises:

converting low-resistance bits into high-resistance bits; and converting high-resistance bits into low-resistance bits.

7. The method of claim 1, wherein the resistance-based memory device is non-volatile memory device.

8. The method of claim 1, wherein the resistance-based memory device is a solid-state memory device.

9. A system for storing a bit sequence, comprising:

logic configured to convert a first bit sequence containing a first number of low-resistance bits into a second bit sequence containing a second number of low-resistance bits that is lower than the first number of low-resistance bits; and a resistance-based memory device for storing the second bit sequence.

10. The system of claim 9, wherein the resistance-based memory device includes a plurality of resistance components, at least some having a first resistance and others having a second resistance that is higher than the first resistance, and wherein a low-resistance bit is stored using a resistive component having the first resistance, and a high-resistance bit is stored using a resistive component having the second resistance.

11. The system of claim 9, wherein the low-resistance bit represents a first logic state and the high-resistance bit represents a second logic state.

12. The system of claim 9, wherein the logic is configured to convert the first bit sequence into a second bit sequence having a greater number of bits.

13. The system of claim 9, wherein the logic is configured to convert the first bit sequence into a second bit sequence by converting low-resistance bits into high-resistance bits and by converting high-resistance bits into low-resistance bits.

14. A method for storing a bit sequence in a resistance-based memory device, the resistance-based memory device storing bits as low-resistance bits and high-resistance bits, said method comprising:

retrieving a first bit sequence from the resistance-based memory device; and converting the first bit sequence containing a first number of low-resistance bits into a second bit sequence containing a second number of low-resistance bits that is higher than the first number of low-resistance bits.

15. The method of claim 14, wherein a low-resistance bit is stored using a resistive component having a first resistance, and a high-resistance bit is stored using a resistive component having a second resistance that is higher than the first resistance.

16. The method of claim 14, wherein a low-resistance bit represents a first logic state and a high-resistance bit represents a second logic state.

17. The method of claim 16, wherein a low-resistance bit is a logic 1 and a high-resistance bit is a logic 0.

18. The method of claim 14, wherein a total number of bits in the second bit sequence is lower than a total number of bits in the first bit sequence.

19. The method of claim 14, wherein the step of converting comprises converting low-resistance bits into high-resistance bits and converting high-resistance bits into low-resistance bits.

20. The method of claim 14, wherein the resistance-based memory device is a solid-state memory device.

21. A computer readable medium comprising:

determination logic configured to determine whether a first bit sequence is to be encoded; and coding logic that is responsive to the determination logic determining that the first bit sequence is to be encoded, and that is configured to convert a first bit sequence containing a first number of low-resistance bits into a second bit sequence containing a second number of low-resistance bits that is lower than the first number of low-resistance bits.

22. The computer readable medium of claim 21, wherein the second bit sequence has a total number of bits that is higher than a total number of bits of the first bit sequence.

23. A computer readable medium comprising:

determination logic configured to determine whether a first bit sequence is to be decoded; and coding logic that is responsive to the determination logic determining that the first bit sequence is to be decoded, and that is configured to convert a first bit sequence containing a first number of low-resistance bits into a second bit sequence containing a second number of low-resistance bits that is higher than the first number of low-resistance bits.

24. The computer readable medium of claim 23, wherein the second bit sequence has a total number of bits that is lower than a total number of bits of the first bit sequence.

* * * * *